(12) United States Patent
Zhang et al.

(10) Patent No.: US 9,230,891 B2
(45) Date of Patent: Jan. 5, 2016

(54) SEMICONDUCTOR DEVICE

(71) Applicant: Mitsubishi Electric Corporation, Tokyo (JP)

(72) Inventors: Hongbo Zhang, Tokyo (JP); Hisashi Kawafuji, Tokyo (JP); Ming Shang, Tokyo (JP); Shinya Nakagawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/246,448

(22) Filed: Apr. 7, 2014

(65) Prior Publication Data

US 2015/0084173 A1    Mar. 26, 2015

(30) Foreign Application Priority Data

Sep. 25, 2013  (JP) .................................. 2013-198812

(51) Int. Cl.
*H01L 23/495* (2006.01)
*H01L 23/00* (2006.01)
*H01L 23/433* (2006.01)

(52) U.S. Cl.
CPC ...... *H01L 23/49575* (2013.01); *H01L 23/4334* (2013.01); *H01L 23/49541* (2013.01); *H01L 23/49562* (2013.01); *H01L 24/43* (2013.01); *H01L 24/49* (2013.01); *H01L 24/85* (2013.01); *H01L 2924/1305* (2013.01); *H01L 2924/13055* (2013.01); *H01L 2924/13091* (2013.01)

(58) Field of Classification Search
USPC .................. 257/666–676, E23.031–E23.059, 257/E21.505, E23.039
See application file for complete search history.

(56) References Cited

U.S. PATENT DOCUMENTS

| | | | | |
|---|---|---|---|---|
| 5,686,758 A | * | 11/1997 | Arai et al. ...................... | 257/693 |
| 2006/0043545 A1 | * | 3/2006 | Yea et al. ...................... | 257/666 |
| 2009/0115038 A1 | * | 5/2009 | Son et al. ...................... | 257/675 |
| 2012/0038033 A1 | * | 2/2012 | Oga et al. ...................... | 257/659 |
| 2012/0326289 A1 | * | 12/2012 | Minamio ....................... | 257/676 |

FOREIGN PATENT DOCUMENTS

| | | |
|---|---|---|
| JP | 2008-277433 A | 11/2008 |
| JP | 2012-256803 A | 12/2012 |

* cited by examiner

*Primary Examiner* — Jasmine Clark
(74) *Attorney, Agent, or Firm* — Studebaker & Brackett PC

(57) ABSTRACT

There is provided a semiconductor device having a converter circuit, a brake circuit and an inverter circuit and manufacturable by a simplified manufacturing process. the semiconductor device has a plurality of die pads, IGBTs, diodes, freewheel diodes, an HVIC and LVICs mounted on the plurality of die pads, a plurality of leads, and an encapsulation resin body that covers these component parts. In a manufacturing process, a single-plate lead frame having the above-described plurality of die pads and leads connected together can be prepared. The semiconductor device may be manufactured by using this single-plate lead frame.

8 Claims, 3 Drawing Sheets

SEMICONDUCTOR DEVICE

BACKGROUND OF THE INVENTION

1. Field of the Invention

The present invention relates to a semiconductor device and method for manufacturing the same.

2. Background Art

A semiconductor device is known which has circuits for inverter drive integrated into one package, as described in Japanese Patent laid-Open No. 2012-256803 for example. More specifically, a power module having a converter circuit, a brake circuit, an inverter circuit and a control circuit board for driving and controlling these circuits housed in one package has been proposed. A module having a converter circuit, a brake circuit and an inverter circuit integrated into one device is generally called a CIB power module.

Other prior art includes Japanese Laid-Open Patent Publication No. 2008-277433.

The semiconductor device according to the related art described above uses a lead frame and a control circuit board in combination. That is, power semiconductor elements are die-bonded on the lead frame and an integrated control circuit is mounted on the control circuit board. The control circuit board referred to herein represents various well-known control circuit boards having a circuit pattern provided on an insulating circuit board so that an integrated control circuit can be mounted. Use of a lead frame and a control circuit board in combination as in the above-described conventional semiconductor device necessitates an assembly process in which both the control circuit board and the lead frame are handled, thereby making the manufacturing process complicated.

SUMMARY OF THE INVENTION

The present invention has been made to solve the above-described problem and an object of the present invention is to provide a semiconductor device having a converter circuit, a brake circuit and an inverter circuit and manufacturable by a simplified manufacturing process.

According to one aspect of the present invention, a semiconductor device includes: a plurality of die pads; an inverter circuit element, a converter circuit element, a brake circuit element, and an integrated circuit mounted on the plurality of die pads; a plurality of leads; and an encapsulation resin body. The plurality of leads are respectively connected via wires to the inverter circuit element, the converter circuit element, the brake circuit element, and the integrated circuit. The encapsulation resin body covers one end portions of the plurality of leads, the inverter circuit element, the converter circuit element, the brake circuit element and the integrated circuit, and the encapsulation resin body does not cover other end portions of the plurality of leads.

Other and further objects, features and advantages of the invention will appear more fully from the following description.

DETAILED DESCRIPTION OF THE PREFERRED EMBODIMENTS

First Embodiment

Figure 1:
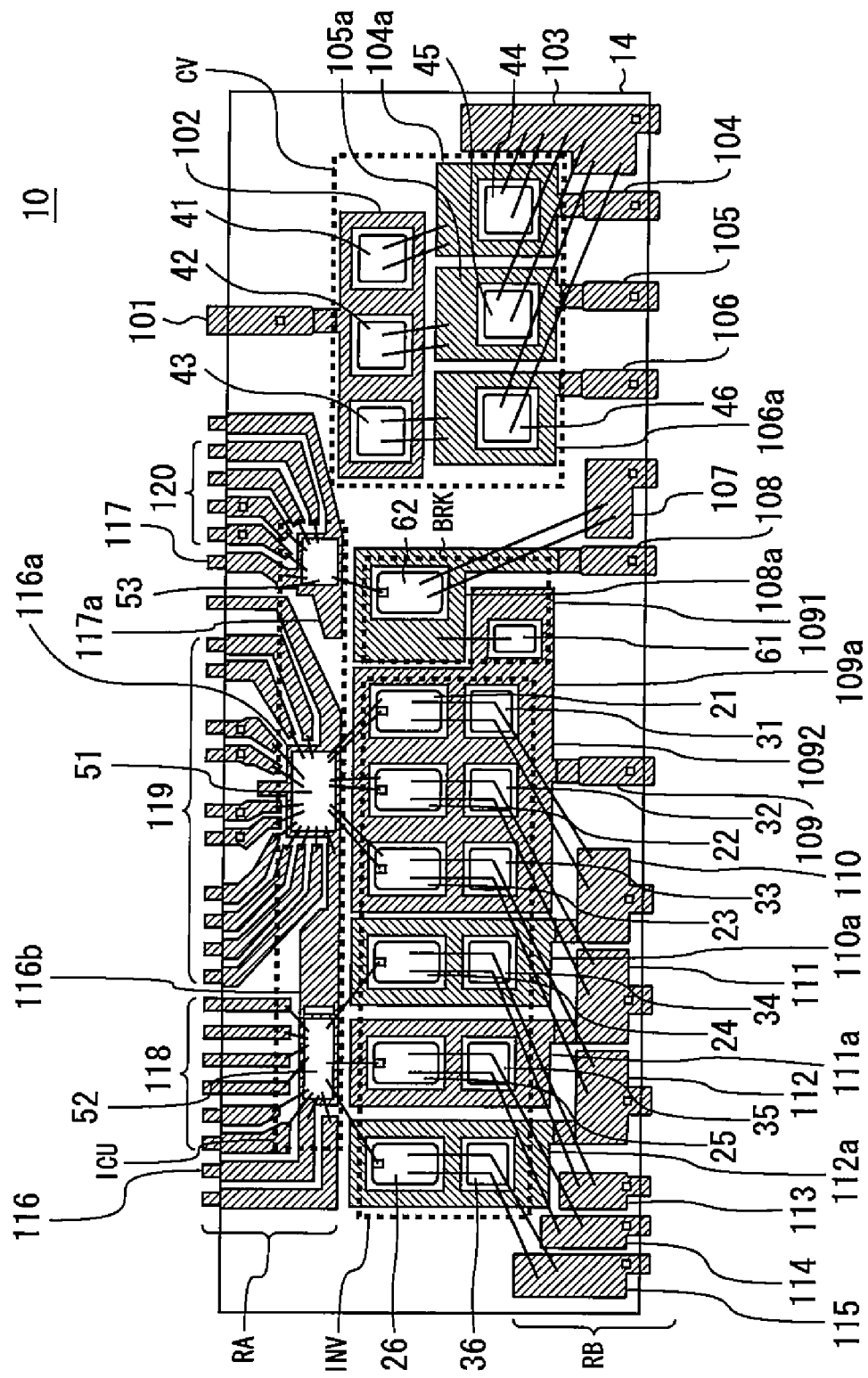
FIG. 1 is a top view showing a semiconductor device according to a first embodiment of the present invention.

FIG. 1 is a top view showing a semiconductor device 10 according to a first embodiment of the present invention. The semiconductor device 10 has CIB circuit elements die-bonded on a plurality of die pads described later and wire-bonded on leads. The CIB circuit elements referred to herein are circuit elements of a converter inverter brake circuit (CIB circuit).

(Die Pads and CIB Circuit Elements)

The semiconductor device 10 incorporates a converter circuit section CV, a brake circuit section BRK, an inverter circuit section INV and an integrated control circuit section ICU. As shown in FIG. 1, the converter circuit section CV, the brake circuit section BRK and the inverter circuit section INV are arranged in a row at one of opposite sides of the semiconductor device 10, while the integrated control circuit section ICU is provided at the other side of the semiconductor device 10. Each of the inverter circuit section INV and the brake circuit section BRK includes an insulated gate bipolar transistor (IGBT) as a circuit element.

The semiconductor device 10 has, in the converter circuit section CV, a die pad 102 and die pads 104a, 105a, and 106a for mounting converter circuit elements. Back electrodes of three diodes 41, 42, and 43 are die-bonded to the die pad 102. The die pad 102 is connected to a lead 101.

A back electrode of the diode 44 is die-bonded to the die pad 104a, a back electrode of the diode 45 to the die pads 105a, and a back electrode of the diode 46 to the die pads 106a. Front electrodes of the diodes 41, 42, and 43 are respectively wire-bonded to the die pads 104a, 105a, and 106a. These semiconductor elements are converter circuit elements in the present embodiment.

The semiconductor device 10 has, in the brake circuit section BRK, a die pad 108a and a die pad region 1091 for mounting a brake circuit element. The die pad region 1091 is a portion of a die pad 109a. A back electrode of an IGBT 62 is die-bonded to the die pad 108a, and a back electrode of a diode 61 is die-bonded to the die pad region 1091. A front electrode of the diode 61 is wire-bonded to the die pad 108a. These semiconductor elements are brake circuit elements in the present embodiment.

The semiconductor device 10 has, in the inverter circuit section INV, die pad regions 1092, 110a, 111a, and 112a for mounting inverter circuit elements. The die pad region 1092 is the portion of the die pad 109a other than the die pad region 1091. Back electrodes of IGBTs 21, 22, and 23 and back electrodes of freewheel diodes 31, 32, and 33 are die-bonded to the die pad region 1092. These semiconductor elements are the inverter circuit elements in the present embodiment.

A front electrode of the IGBT 21 is wire-bonded to a front electrode of the freewheel diode 31. A front electrode of the IGBT 22 is wire-bonded to a front electrode of the freewheel diode 32. A front electrode of the IGBT 23 is wire-bonded to a front electrode of the freewheel diode 33.

Back electrodes of an IGBT 24 and a freewheel diode 34 are die-bonded to the die pad 110a. Back electrodes of an IGBT 25 and a freewheel diode 35 are die-bonded to the die pad 111a. Back electrodes of an IGBT 26 and a freewheel diode 36 are die-bonded to the die pad 112a.

A front electrode of the IGBT 24 is wire-bonded to a front electrode of the freewheel diode 34. A front electrode of the IGBT 25 is wire-bonded to a front electrode of the freewheel diode 35. A front electrode of the IGBT 26 is wire-bonded to a front electrode of the freewheel diode 36.

The semiconductor device 10 has, in the integrated control circuit section ICU, die pads 116a and 116b and a die pad 117a. The die pads 116a and 116b are integrated into a lead 116. A high-withstand-voltage integrated circuit (HVIC) 51 is die-bonded to the die pad 116a. A low-withstand-voltage integrated circuit (LVIC) 52 is die-bonded to the die pad 116b. The die pad 117a is a portion of a lead 117. A low-withstand-voltage integrated circuit (LVIC) 53 is die-bonded to the die pad 117a.

The IGBTs 21 to 26 and the freewheel diodes 31 to 36 provided as inverter circuit elements, the diodes 41 to 46 provided as converter circuit elements, the diode 61 and the IGBT 62 provided as brake circuit elements and the HVIC 51 and the LVICs 52 and 53 that are integrated circuits are mounted on the plurality of die pads enumerated above.

(Leads)

The semiconductor device 10 has a plurality of leads for electrical connection of the above-described CIB circuit elements and integrated circuits on the outside of the package.

The semiconductor device 10 has leads 101, 103, 104, 105, and 106 in the converter circuit section CV. The lead 101 is connected to the die pad 102. The lead 103 is wire-bonded to front electrodes of the diodes 44, 45, and 46. The lead 104 is connected to the die pad 104a, the lead 105 to the die pad 105a, and the lead 106 to the die pad 106a.

The semiconductor device 10 has leads 107 and 108 in the brake circuit section BRK. The lead 107 is wire-bonded to a front electrode of the IGBT 62. The lead 108 is connected to the die pad 108a.

The semiconductor device 10 has leads 109, 110, 111, 112, 113, 114, and 115 in the inverter circuit section INV. The lead 109 is connected to the die pad 109a. The lead 110 is connected to the die pad 110a and wire-bonded to the front electrode of the freewheel diode 31.

The lead 111 is connected to the die pad 111a and wire-bonded to the front electrode of the freewheel diode 32. The lead 112 is connected to the die pad 112a and wire-bonded to the front electrode of the freewheel diode 33.

The lead 113 is wire-bonded to the front electrode of the freewheel diode 34. The lead 114 is wire-bonded to the front electrode of the freewheel diode 35. The lead 115 is wire-bonded to the front electrode of the freewheel diode 36.

The semiconductor device 10 has leads 116 and 117 and a plurality of leads 118, a plurality of leads 119, and a plurality of leads 120 in the integrated control circuit section ICU. The lead 116 is connected to the die pads 116a and 116b and integral with these die pads. The lead 117 is connected to the die pad 117a.

The plurality of leads 118 are a plurality of leads arranged adjacent to the lead 116 and respectively wire-bonded to electrode terminals provided on a front surface of the LVIC 52. The plurality of leads 119 are a plurality of leads arranged adjacent to the plurality of leads 118 and respectively wire-bonded to electrode terminals provided on a front surface of the HVIC 51. The plurality of leads 120 are a plurality of leads arranged adjacent to the lead 117 and respectively wire-bonded to electrode terminals provided on a front surface of the LVIC 53.

The HVIC 51 is wire-bonded to control terminals (i.e., gate terminals) of the IGBTs 21, 22, and 23. The LVIC 52 is wire-bonded to control terminals (i.e., gate terminals) of the IGBTs 24, 25, and 26. The LVIC 53 is wire-bonded to a control terminal (i.e., a gate terminal) of the IGBT 62.

Referring to FIG. 1, the plurality of leads provided in the semiconductor device 10 are divided into a lead group RA and a lead group RB. The lead group RA is a group of leads arranged along one of opposite sides of the package of the semiconductor device 10. The lead group RA is formed by the leads 101, and 116 to 120. The lead group RB is a group of leads arranged along the other side of the package of the semiconductor device 10. The lead group RB is formed by the leads 103 to 115.

In a manufacturing process, a single-plate lead frame having the above-described plurality of die pads 102, 104a to 112a, 116a, 116b, and 117a and leads 101, and 103 to 120 made of one metal material and connected together by an outer frame portion can be prepared. The semiconductor device 10 may be manufactured by using this single-plate lead frame and performing a mounting process, a resin-encapsulation process and an outer frame lead cutting process each known per se.

More specifically, referring to FIG. 1, each of long frame portions extending along opposite sides of an encapsulation resin body 14 connects together the leads in the corresponding one of the lead groups RA and RB. This portion is cut off after the resin molding process and before the completion of the product.

(Encapsulation Resin Body)

The encapsulation resin body 14 is provided by transfer molding so as to cover the internal structure including the die pads, IGBT 21 and HVIC 51 shown in FIG. 1. The encapsulation resin body 14 covers inner end portions of the plurality of leads, inverter circuit elements, converter circuit elements, brake circuit elements and integrated circuits enumerated above but does not cover outer end portions of the plurality of leads enumerated above. The material of encapsulation resin body 14 is a thermosetting resin.

<Circuits in the First Embodiment>

Figure 2:
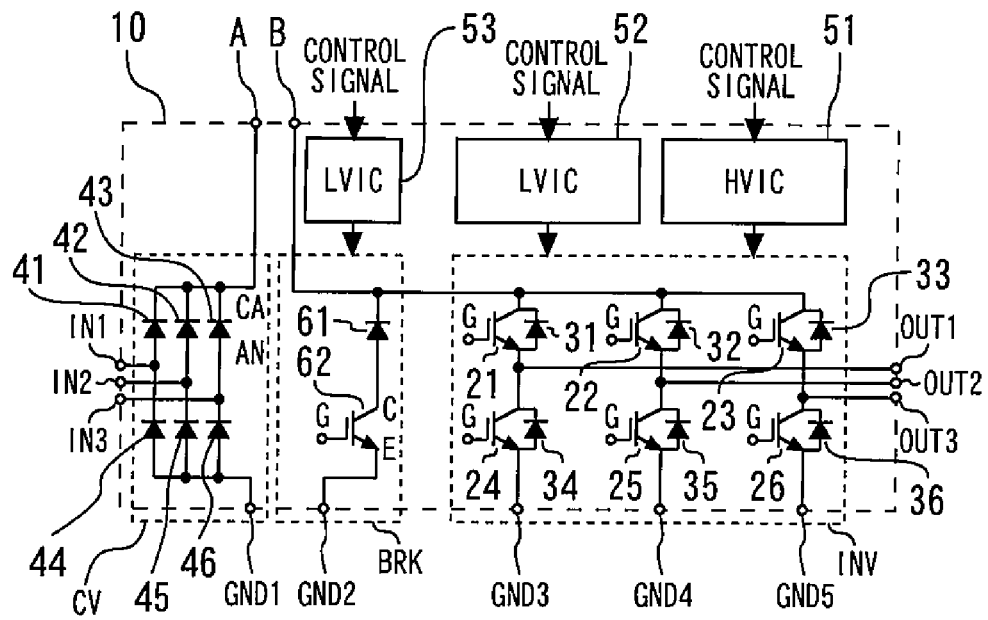
FIG. 2 is a circuit diagram of the semiconductor device according to the first embodiment of the present invention.

FIG. 2 is a circuit diagram of the semiconductor device 10 according to the first embodiment of the present invention. The same circuit elements as those shown in FIG. 1 are indicated by the same reference numerals.

The semiconductor device 10 has input terminals IN1, IN2, and IN3, which are connected to the converter circuit section CV.

The semiconductor device 10 has in the converter circuit section CV a circuit described below. The input terminal IN1 is connected to a connection point between the anode of the diode 41 and the cathode of the diode 44. The input terminal IN2 is connected to a connection point between the anode of the diode 42 and the cathode of the diode 45. The input terminal IN3 is connected to a connection point between the anode of the diode 43 and the cathode of the diode 46.

The anodes of the diodes 44, 45, and 46 are electrically connected to each other and connected to a ground terminal GND1. The cathodes of the diodes 41, 42, and 43 are electrically connected to each other and connected to a terminal A shown in FIG. 1.

In the brake circuit section BRK, the cathode of the diode 61 is connected to a terminal B shown in FIG. 2. The anode of the diode 61 is connected to the collector of the IGBT 62. The emitter of the IGBT 62 is connected to a ground terminal GND2.

The semiconductor device 10 has three arm circuits in the inverter circuit section INV. The first arm circuit is an arm formed by a series connection of the IGBT 21 and the IGBT 24. The collector of the IGBT 21 is connected to the terminal B, which is electrically common to the cathode of the diode 61. The emitter of the IGBT 21 is connected to the collector of the IGBT 24. An output terminal OUT1 is connected to a connection point between the emitter of the IGBT 21 and the collector of the IGBT 24.

The second arm circuit is an arm formed by a series connection of the IGBT 22 and the IGBT 25. The collector of the IGBT 22 is also connected to the terminal B. The emitter of the IGBT 22 is connected to the collector of the IGBT 25. An output terminal OUT2 is connected to a connection point between the emitter of the IGBT 22 and the collector of the IGBT 25.

The third arm circuit is an arm formed by a series connection of the IGBT 23 and the IGBT 26. The collector of the IGBT 23 is also connected to the terminal B. The emitter of the IGBT 23 is connected to the collector of the IGBT 26. An output terminal OUT3 is connected to a connection point between the emitter of the IGBT 23 and the collector of the IGBT 26.

The emitters of the IGBTs 24, 25, and 26 are connected to ground terminals GND3, GND4, and GND5, respectively.

The HVIC 51 can send control signals to gates G of the IGBTs 21, 22, and 23, which are upper arms. The LVIC 52 can send control signals to gates G of the IGBTs 24, 25, and 26, which are lower arms. Each of these control signals is ordinarily a PWM signal duty-ratio-controlled.

The LVIC 53 can send a control signal to a gate G of the IGBT 62 in the brake circuit section BRK.

In the present embodiment, as described above, a plurality of circuit elements and integrated circuits are mounted on a lead frame and encapsulated in a resin, and no insulating circuit board is used. Therefore, the assembly process is simplified and a low-priced package can be provided.

Since no control circuit board is used, the entire module can easily be reduced in size. The manufacturing cost can be reduced by avoiding use of a control circuit board, because an ordinary control circuit board itself is provided at a high cost. Printed-circuit boards (PCB boards) among control circuit boards have the drawback of being particularly low in moisture resistance. Lead frames made of metals are generally higher in moisture resistance than control circuit boards made, for example, by forming a wiring pattern on an insulating material.

While IGBTs are used in the present embodiment, MOSFETs may alternatively be used.

Second Embodiment

Figure 3:
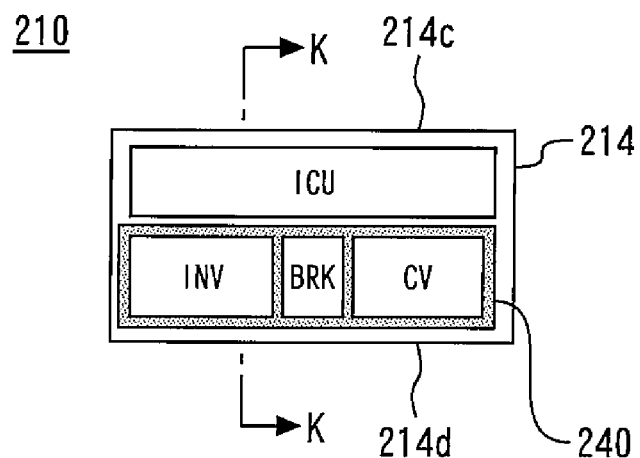
FIG. 3 is a top view showing a semiconductor device according to a second embodiment of the present invention.

FIG. 3 is a top view showing a semiconductor device 210 according to a second embodiment of the present invention. In the top view of FIG. 3, however, a converter circuit section CV, a brake circuit section BRK, an inverter circuit section INV and an integrated control circuit section ICU are shown simply in circuit block form.

The internal constructions of the converter circuit section CV, brake circuit section BRK, inverter circuit section INV and integrated control circuit section ICU are the same as those in the semiconductor device 10 according to the first embodiment shown in FIG. 1. Die pads and leads of the semiconductor device 210 are not illustrated in FIG. 3. The construction of the die pads and leads of the semiconductor device 210 as seen in the top view is the same as that in the semiconductor device 10 according to the first embodiment.

The semiconductor device 210 has an encapsulation resin body 214 formed by transfer molding. The encapsulation resin body 214 has side surfaces 214c and 214d facing in opposite directions. The integrated control circuit section ICU is provided on the side surface 214c side of a center of the encapsulation resin body 214, while the converter circuit section CV, the brake circuit section BRK and the inverter circuit section INV are one-sidedly disposed on the side surface 214d side by being arranged in a row. In this way, the integrated control circuit section ICU and the circuit sections (power sections) in which power semiconductor elements such as IGBTs are provided can be provided separately from each other.

The semiconductor device 210 has an insulating sheet 240. The insulating sheet 240 has such an area as to extend over all the converter circuit section CV, the brake circuit section BRK and the inverter circuit section INV. The insulating sheet 240 does not reach the integrated control circuit section ICU. The insulating sheet 240 is made of an epoxy resin.

The insulating sheet 240 is in contact with back surfaces of die pads 102, 104a, 105a, and 106a belonging to the converter circuit section CV. The insulating sheet 240 is in contact with back surfaces of die pads 108a and 109a belonging to the brake circuit section BRK. The insulating sheet 240 is in contact with back surfaces of die pads 110a, 111a, and 112a belonging to the inverter circuit section INV and a back surface of a die pad 209a described below.

Figure 4A:
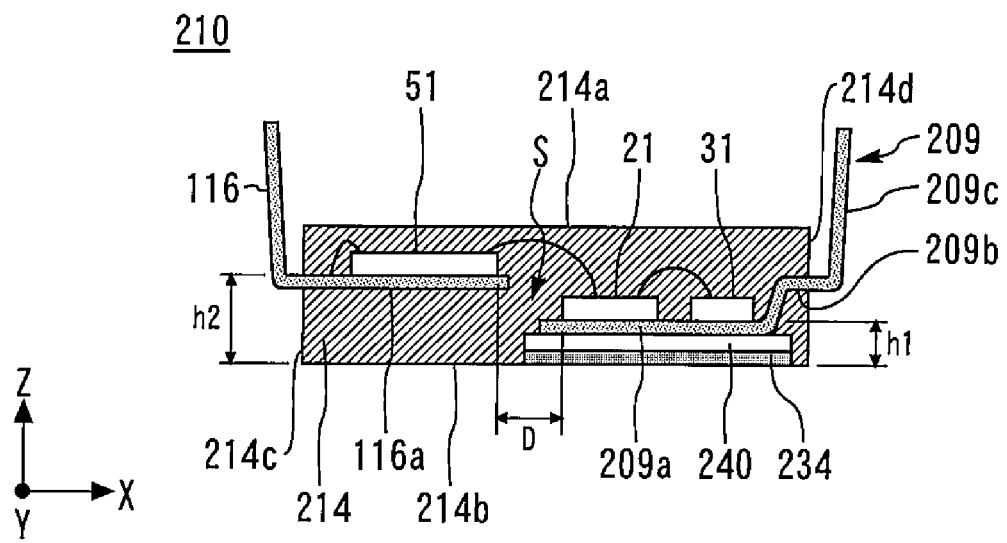
FIG. 4A is a sectional view of the semiconductor device according to the second embodiment of the present invention, taken along line K-K in FIG. 3.

FIG. 4A is a sectional view of the semiconductor device 210 according to the second embodiment of the present invention, taken along line K-K in FIG. 3. In X-, Y-, and Z-axes shown in FIG. 4A, the Z-axis corresponds to the thickness direction of the semiconductor device 210, and the X- and Y-axes correspond to plane directions of the semiconductor device 210.

The semiconductor device 210 is the same as the semiconductor device 10 according to the first embodiment in having the lead 116 and the HVIC 51. However, the semiconductor device 210 differs from the semiconductor device 10 according to the first embodiment in that the semiconductor device 210 has a lead 209, the insulating sheet 240 and heat radiating copper foil 234.

The semiconductor device 210 is packaged in the encapsulation resin body 214. The encapsulation resin body 214 has an upper surface 214a, a bottom surface 214b and the side surfaces 214c and 214d, which are flat surfaces defining its external shape.

The lead 209 includes the die pad 209a, a bent portion 209b bent from the die pad 209a in the thickness direction, and an outer lead portion 209c that connects to the bent portion 209b. The IGBT 21 and the freewheel diode 31 are die-bonded to the die pad 209a. Wire bonding is also performed between the IGBT 21 and the freewheel diode 31. With the bent portion 209b, the die pad 209a is stepped in the thickness direction.

The die pad 209a and the die pad 116a are shifted from each other in the thickness direction. The "thickness direction" denotes the direction of thickness of the die pad 209a and the die pad 116a corresponding to the Z-axis direction shown in FIG. 4A.

The heights of front surfaces of the die pad 209a and the die pad 116a as defined on the bottom surface 214b of the encapsulation resin body 214 are as described below. The height of the front surface of the die pad 209a is h1; the height of the front surface of the die pad 116a is h2; and h1<h2.

Figure 4B:
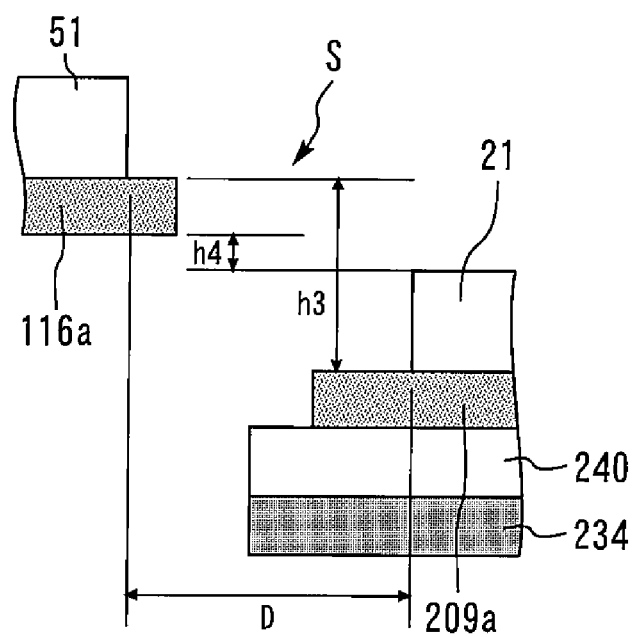
FIG. 4B is an enlarged sectional view for explanation of the step height.

A step height S is created between the front surface of the die pad 209a and the front surface of the die pad 116a. FIG. 4B is an enlarged sectional view for explanation of the step height S. The step height S is h3.

The height from a front surface of the IGBT 21 to a back surface of the die pad 116a is h4. Preferably, the height h4 is set large enough to reliably shield noise due to switching of the IGBT 21 with the die pad 116a.

A back surface of the die pad 209a is in contact with an upper surface of a stack structure formed by the insulating sheet 240 and the heat radiating copper foil 234. The insulating sheet 240 is made of an epoxy resin having a high heat radiating property and an insulating property. The heat radiating copper foil 234 is thin copper foil having one surface on the bottom surface 214b side exposed. The die pad 209a is brought closer to the bottom surface 214b relative to the die pad 116a. Accordingly, the IGBT 21, the freewheel diode 31 and other parts on the die pad 209a are also disposed closer to the bottom surface 214b.

The advantages of the present embodiment will be described. For ease of description, the IGBTs 21 to 26, and 62, the diodes 41 to 46, and 61, and the freewheel diodes 31 to 36 are referred to collectively as "IGBT 21 and other components" below.

When the HVIC 51 and the LVICs 52 and 53 are disposed in the IGBT 21 and other components, there is a possibility of noise generated with the operation of the IGBT 21 and other components (more specifically, the switching operation of the IGBTs) causing a malfunction in the HVIC 51 and the LVICs 52 and 53.

The HVIC 51 and the LVICs 52 and 53 are required to be placed sufficiently away from the IGBT 21 and other components in order to avoid the influence of noise. If the HVIC 51 and the LVICs 52 and 53 are placed away from the IGBT 21 and other components along the plane directions, the size of the power module is increased.

In this regard, in the semiconductor device 210 according to the second embodiment, the step height S is provided between the HVIC 51 and LVICs 52 and 53 and the IGBT 21 and other components. The provision of the step height S enables the metal lead frames (that is die pads) on which the HVIC 51 and the LVICs 52 and 53 are mounted to serve as a shield. As a result, the HVIC 51 and the LVICs 52 and 53 cannot easily be influenced by noise caused by the operation of the IGBT 21 and other components.

Since the shielding function is provided by setting the step height S, the plane direction distance between the HVIC 51 and LVICs 52 and 53 and the IGBT 21 and other components (that is distance D in FIG. 4B) can be reduced. As a result, the plane direction size of the module can be reduced.

Since the IGBT 21 and other components are combined on the side surface 214d side and arranged in a row, the provision of the insulating sheet 240 in rectangular form on the side surface 214d side suffices. This arrangement enables reducing the necessary area of the insulating sheet 240 relative to that in a case where the IGBT 21 and other components are artlessly disposed, thereby achieving a reduction in manufacturing cost.

Further, the sum of the thicknesses of the die pad 209a and the stack structure formed by the insulating sheet 240 and the heat radiating copper foil 234 can be set to a small value. Therefore, heat generated by the IGBT 21 and other components can be transferred to the bottom surface 214b side through a short path, thus ensuring good heat radiating performance.

In the second embodiment, the step height S is provided between the die pad 209a and the die pad 116a, as shown in FIG. 4A. However, the present invention is not limited to this.

Part or all of the die pads 102, 104a, 105a, and 106a belonging to the converter circuit section CV, the die pads 108a and 109a belonging to the brake circuit section BRK and the die pads 110a, 111a, and 112a belonging to the inverter circuit INV in the first embodiment may be bent by providing bend portions 209b, as is the die pad 209a. Step heights S may be provided in this way between the die pads 116a, 116b, and 117a and the die pads belonging to the converter circuit section CV, the brake circuit section BRK and the inverter circuit section INV.

The features and advantages of the present invention may be summarized as follows. According to the present invention, a semiconductor device has a converter circuit, a brake circuit and an inverter circuit, and the process of manufacturing the semiconductor device is simplified.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-198812, filed on Sep. 25, 2013 including specification, claims, drawings and summary, on which the Convention priority of the present application is based, is incorporated herein by reference in its entirety.

What is claimed is:

1. A semiconductor device comprising:
   a plurality of die pads;
   an inverter circuit element, a converter circuit element, a brake circuit element, and an integrated circuit mounted on the plurality of die pads;
   a plurality of leads respectively connected via wires to the inverter circuit element, the converter circuit element, the brake circuit element, and the integrated circuit; and
   an encapsulation resin body covering one end portions of the plurality of leads, the inverter circuit element, the converter circuit element, the brake circuit element and the integrated circuit, and not covering other end portions of the plurality of leads,
   wherein at least two of the plurality of die pads are shifted from each other in a thickness direction.

2. The semiconductor device according to claim 1, wherein the plurality of die pads includes:
   an integrated circuit die pad on which the integrated circuit is mounted; and
   an element die pad provided adjacent to and parallel to the integrated circuit die pad, at least one of the converter circuit element, the brake circuit element and the inverter circuit element mounted on the element die pad;
   and wherein the element die pad and the integrated circuit die pad are shifted from each other in a thickness direction.

3. The semiconductor device according to claim 1, wherein the plurality of die pads and the plurality of leads are formed by lead cutting a single-plate lead frame made of one metal material.

4. The semiconductor device according to claim 1, wherein the inverter circuit element includes a plurality of arm circuits, each of the arm circuits including a plurality of first switching elements connected in series to each other,
   the converter circuit element includes a plurality of a pair of first diodes, the pair of the first diodes connected in series to each other, the pairs of the first diodes connected in parallel to each other,
   the brake circuit element includes a second diode and a second switching element, the second diode and the second switching element connected in series to each other,
   the integrated circuit includes a high-withstand-voltage integrated circuit and a low-withstand-voltage integrated circuit, the inverter circuit element, the brake circuit element, and the converter circuit element are arranged in this order in a row on one side of the encapsulation resin body, the high-withstand-voltage integrated circuit and the low-withstand-voltage integrated circuit are arranged in a row on other side of the encapsulation resin body, the other side is opposite side to the one side, the low-withstand-voltage integrated circuit is provided at a center of the one side, the high-withstand-voltage integrated circuit is provided at a side close to the inverter circuit element, the high-withstand-voltage integrated circuit supplies a control signal to the first switching element, and the low-withstand-voltage integrated circuit supplies a control signal to the second switching element.

5. The semiconductor device according to claim 2, wherein the plurality of die pads includes:
   a first die pad having a front surface and a back surface, the inverter circuit element mounted on the front surface of the first die pad;
   a second die pad having a front surface and a back surface, the converter circuit element mounted on the front surface of the second die pad; and
   a third die pad having a front surface and a back surface, the brake circuit element mounted on the front surface of the third die pad;
   and wherein the first to third die pads are arranged in a row on one side of the encapsulation resin body, and
   the semiconductor device further comprising an insulating sheet contacting the back surfaces of the first to third die pads.

6. A semiconductor device comprising:
   a plurality of die pads;
   an inverter circuit element, a converter circuit element, a brake circuit element, and an integrated circuit mounted on the plurality of die pads;
   a plurality of leads respectively connected via wires to the inverter circuit element, the converter circuit element, the brake circuit element, and the integrated circuit; and
   an encapsulation resin body covering one end portions of the plurality of leads, the inverter circuit element, the converter circuit element, the brake circuit element and the integrated circuit, and not covering other end portions of the plurality of leads,
   wherein the plurality of die pads includes:
      a first die pad having a front surface and a back surface, the inverter circuit element mounted on the front surface of the first die pad;
      a second die pad having a front surface and a back surface, the converter circuit element mounted on the front surface of the second die pad; and
      a third die pad having a front surface and a back surface, the brake circuit element mounted on the front surface of the third die pad;
   and wherein the first to third die pads are arranged in a row on one side of the encapsulation resin body, and
   the semiconductor device further comprising an insulating sheet contacting the back surfaces of the first to third die pads.

7. The semiconductor device according to claim 6, wherein the insulating sheet includes a front surface and a back surface,
   the front surface of the insulating sheet contacts to the back surfaces of the first to third die pads,
   and the semiconductor device further comprising a metal foil covering the back surface of the insulating sheet,
   wherein the encapsulation resin body does not cover the metal foil.

8. A semiconductor device comprising:
   a plurality of die pads;
   an inverter circuit element, a converter circuit element, a brake circuit element, and an integrated circuit mounted on the plurality of die pads;
   a plurality of leads respectively connected via wires to the inverter circuit element, the converter circuit element, the brake circuit element, and the integrated circuit; and
   an encapsulation resin body covering one end portions of the plurality of leads, the inverter circuit element, the converter circuit element, the brake circuit element and the integrated circuit, and not covering other end portions of the plurality of leads,
   wherein no control circuit board for mounting the inverter circuit element, the brake circuit element, and the converter circuit is provided.

* * * * *